Sept. 24, 1963 A. L. MacDONALD, JR 3,104,991
METHOD OF PREPARING SEMICONDUCTOR MATERIAL
Filed Sept. 23, 1958

INVENTOR
ALEX L. MacDONALD, JR.

BY N. Vincent Harsha
ATTORNEY

United States Patent Office 3,104,991

Patented Sept. 24, 1963

3,104,991

METHOD OF PREPARING SEMICONDUCTOR MATERIAL

Alex L. MacDonald, Jr., Quincy, Mass., assignor to Raytheon Company, Lexington, Mass., a corporation of Delaware Filed Sept. 23, 1958, Ser. No. 762,864
5 Claims. (Cl. 148—1.5)

This invention relates generally to semiconductor material and, more particularly, to methods of preparing said material by a double diffusion process.

A conventional semiconductor device, such as a silicon diode, is made up of a silicon material having two regions, one containing a p-type impurity and the other containing an n-type impurity. It has been found that significant improvement in the electric characteristics of such diodes can be obtained if a third region containing either a more concentrated amount of n-type impurity or a more concentrated amount of p-type impurity is introduced into the diode. When the third region contains a more concentrated n-type impurity it is conventionally defined as an n+ region, so that the diode is sometimes referred to as a p-n-n+ junction diode. When the third region contains a more concentrated p-type impurity it is conventionally defined as a p+ region and the diode is referred to as a p+-p-n junction diode.

In order to fabricate such junction diodes, it is necessary to use double diffusion methods. For instance, to obtain a p-n-n+ diode, a p-type impurity is diffused into one region of an n-type semiconductor material to provide a p-n junction, and an n-type impurity is independently diffused into another region to provide an n-n+ junction. Similarly, to obtain a p+-p-n diode, a p-type impurity is diffused into one region of a p-type semiconductor material to provide a p+-p junction, and an n-type impurity is independently diffused into another region to provide a p-n junction.

One of the major problems which occurs during the second diffusion process in either case is that a portion of the n-type impurity penetrates into the p region of the p-n-n+ diode or into the p+ region of the p+-p-n diode. It is necessary, therefore, to mask the p region of p-n-n+ type and the p+ region of the p+-p-n type in some manner to prevent such penetration. One prior method that has been used is to form a layer of silicon oxide on the surface area of the region to be masked in order to protect that region from penetration by the n-type impurity. However, this method has a disadvantage in that the silicon oxide does not prevent penetration, but merely slows down the penetration process. Hence, if it is desirable to obtain a relatively thick n+ region in the p-n-n+ diode or a relatively thick n region in the p+-p-n diode, the time required for such diffusion is so long that a portion of the n-type material eventually penetrates the silicon oxide layer and reaches the regions which are purportedly being protected.

This invention overcomes this disadvantage by providing a more efficient mask for the p or p+ regions. The mask provided by the invention prevents any penetration of the n-type material into these regions, no matter how thick an n+ region or an n region is desired. For example, in one embodiment of this invention wherein it is desired to obtain a p-n-n+ diode, a slice of n-type silicon is placed into a solution of boric acid. As the silicon slice is slowly withdrawn from the solution, a film of boric acid is deposited on the surface of the slice. The slice is then heated, as in a conventional diffusion process, at a high temperature so that boron (a p-type element) is released from the boric acid and is allowed to diffuse into the silicon slice to form a region having a p-type impurity. At the same time, the diffusion process forms a layer of glass-like material containing boron, oxygen, and silicon on the surface of the semiconductor material. This glass-like layer provides a mask for the p region.

A portion of the p region and a portion of the glass-like layer are removed to expose the n region of the silicon slice. An n-type material, such as phosphorous, is then diffused into a portion of the exposed n region to form an n+ region. Because of the glass-like layer surrounding and, thereby, masking the p region, none of the n-type impurity is allowed to penetrate into the p region.

To explain this invention more fully, a more detailed description will be given of the application of the double diffusion method of this invention for the fabrication of p-n-n+ diodes. The invention can be more easily understood with he help of the drawing in which.

Figure 1:
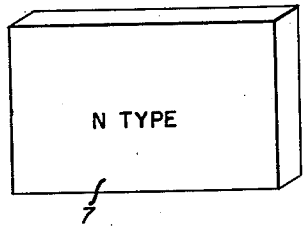
FIG. 1 shows a pictorial view of an n-type silicon semiconductor slice.

In order to form a large number of semiconductor diode devices by the method of this invention, it is necessary to provide initially a relatively large slice 7 of silicon having an n-type impurity, as shown in FIG. 1. Silicon slice 7 is placed into a concentrated solution of boric acid which has been heated to about 90–100° C. The silicon slice is left in the boric acid solution for a length of time necessary for the slice to reach approximately the temperature of the solution. It has been found that about thirty seconds is usually sufficient for this heating to occur.

Figure 2:
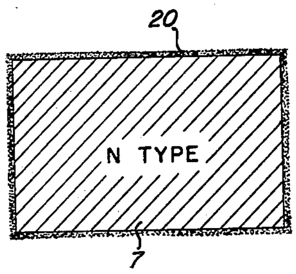
FIG. 2 shows a cross-section of the silicon slice of FIG. 1 having a film of boric acid deposited thereon.

The slice is then slowly and uniformly withdrawn from the solution in any convenient manner, as, for example, with a pair of tweezers. As the slice is withdrawn, a film of boric acid is thereby deposited on the surface of the slice. Because the slice is withdrawn slowly and because the temperatures of the slice and solution are approximately equal, an even film of boric acid is thus deposited over the entire surface. The film of boric acid dries very rapidly as the slice is removed from the solution to form an even coating over the entire surface. Silicon slice 7 with boric acid coating 20 is shown in cross-section in FIG. 2. At this point, the silicon material is ready for the first diffusion process.

Figure 3:
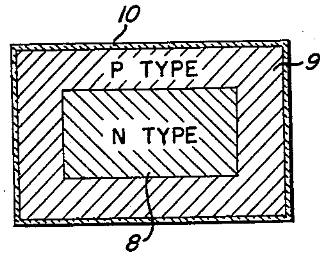
FIG. 3 shows the silicon slice of FIG. 2 after the first diffusion process.

In the first diffusion process, conventional diffusion methods are utilized. For instance, the silicon material with its film of boric acid is heated to a temperature of approximately 1300° C. At this temperature, boron from the boric acid solution is released and diffuses into the n-type silicon slice to form a region 9 having a p-type impurity as shown in FIG. 3. At the same time, a layer 10 of glass-like masking material containing boron, silicon, and oxygen is formed over the entire surface of the silicon slice. Although the exact structure of the layer so formed is not completely known at the present time, it is believed that this layer is amorphous and is not, therefore, a crystalline structure. Hence, for purposes of this specification, it will be defined as a boro-silicate glass.

Figure 4:
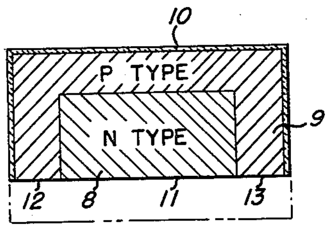
FIG. 4 shows the silicon slice of FIG. 3 after a portion of the p region and glass-like layer has been removed.

A portion of boro-silicate glass layer 10 and a portion of region 9 containing the boron p-type impurity are removed from the silicon slice by grinding or some equivalent process. The silicon slice is then in a condition shown in FIG. 4 in which n region 8 is exposed along line 11. Small portions of p region 9 also become exposed at 12 and 13. The portion of layer 10 of boro-silicate glass that remains provides a mask of protective material around the major portion of the p-type region. The silicon slice shown in FIG. 4 is then ready for the second diffusion process.

Figure 5:
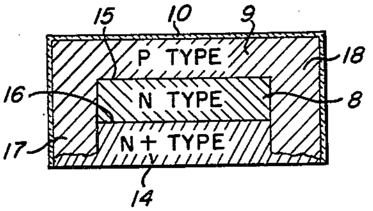
FIG. 5 shows the silicon slice of FIG. 4 after an n+ region has been formed by a second diffusion process.

In the second diffusion process an n-type impurity is diffused into the exposed n region 8 to form an n+ region. This process can be carried on by conventional methods. One conventional method is to place the silicon slice into a tube at a high temperature, for example, at approximately 1200° C. Phosphorous pentoxide gas is then fumed into the tube and phosphorous is, thereby, diffused into the n region. The phosphorous, being itself an n-type impurity, thereby forms a region 14 denoted as an n+ region of impurity as shown in FIG. 5. Some of the phosphorous impurity is diffused into a portion of the p region not having the protective mask of boro-silicate glass as is shown in the figure. As seen in FIG. 5, none of the phosphorous impurity is able to penetrate the major portion of region 9 that is protected by the mask of boro-silicate glass. The composition shown in FIG. 5 provides a semiconductor material having a p-n junction at 15 and an n-n+ junction at 16.

Figure 6:
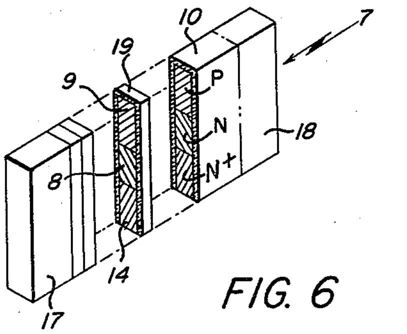
FIG. 6 shows a pictorial view of the silicon slice prepared according to the method of this invention wherein portions of said slice have been removed to form semiconductor diode devices.

As shown in FIG. 6, a large number of p-n-n+ junction diodes can be obtained from silicon slice 7 that has been formed by the double diffusion process described above. These diodes can be formed in any convenient manner, as by cutting or slicing diode chips of appropriate dimensions. A typical chip 19 is shown in FIG. 6. As shown in that figure, chip 19 has p region 9, n region 8, and n+ region 14, providing appropriate p-n and n-n+ junctions. End portions 17 and 18, as shown in FIGS. 5 and 6, do not contain the appropriate junctions and, thus, cannot be used to provide usable diode chips.

In adding the n-type impurity during the second diffusion process, it is not necessary to restrict the method of the invention to the use of phosphorous. Any of the well-known n-type impurities may be used in the second diffusion process. The invention is not restricted to the use of silicon material. Any semiconductor material having properties that allow it to be used for semiconductor diode or transistor purposes or the like may be used. The temperature of the boric acid solution is not necessarily critical, although it has been found that temperatures in the range of 90–100° are preferable for efficient operation. The diffusion temperatures used in the first and second diffusion process similarly are not critical, but are determined, in a practical sense, by the amount of time available for the diffusion process. A lower diffusion temperature will require a longer diffusion time.

As stated previously, the method of the invention is not restricted to the formation of p-n-n+ diode devices from n-type material only. The method will work equally as well with p-type silicon. In this case, preparation of p-type silicon by the method of the invention results in a p+-p-n diode device having advantageous electrical properties similar to those of the p-n-n+ device. This technique can also be used in providing masking for transistor applications in order to provide, for example, n-p-n or n-p-n-p configurations, the boro-silicate glass masking material being removed from the required regions after the first diffusion. Hence, the invention is not to be construed to be limited by the particular embodiment described herein except as defined by the appended claims.

What is claimed is:

1. A method of preparing semiconductor devices comprising the steps of placing a piece of silicon material containing an n-type impurity into a concentrated solution of boric acid; withdrawing said silicon piece at a predetermined rate from said solution; heating said silicon piece at a high temperature to provide a p-type impurity region within a portion of said silicon piece and to deposit a layer of non-metallic masking material on the surface of said silicon semiconductor material; removing a portion of said masking material and a portion of said p-type impurity region to expose a region of said n-type silicon material; and diffusing an n-type impurity into said exposed n region to form an n+ region, whereby a silicon piece having p-n and n-n+ junctions is obtained.

2. A method of preparing semiconductor devices comprising the steps of placing a piece of silicon material containing a p-type impurity into a concentrated solution of boric acid; withdrawing said silicon piece from said solution at a rate whereby an even film of said boric acid is deposited on the surface of said semiconductor material; heating said silicon piece at a higher temperature to provide a p+-type impurity region within a portion of said silicon piece and to deposit a layer of non-metallic masking material on the surface of said silicon semiconductor material; removing a portion of said masking material and a potrion of said p+-type impurity region to expose a region of said p-type silicon material; and diffusing an n-type impurity into said exposed p region to form an n region, whereby a silicon piece having p+-p and p-n junctions is obtained.

3. A method of preparing semiconductor devices comprising the steps of placing a silicon slice containing an n-type impurity into a heated concentrated solution of boric acid; leaving said slice in said solution until the temperature of the slice is approximately equal to that of the solution; withdrawing said silicon slice from said solution at a rate whereby an even film of said boric acid is deposited on the surface of said semiconductor material; heating said withdrawn slice at a high temperature to provide a p-type impurity region within a portion of said slice and to deposit a layer of non-metallic masking material comprising at least boron, silicon and oxygen on the surface of said silicon slice; removing a portion of said masking material and a portion of said p-type impurity region to expose a portion of said n-type slice; and diffusing an n-type impurity into said exposed n region of said slice to form an n+ region, whereby a semiconductor material having p-n and n-n+ junctions is obtained.

4. A method of preparing silicon material for semiconductor devices comprising the steps of placing a piece of silicon material containing an n-type impurity into a concentrated solution of boric acid at a temperature of 90–100° C. for a period of time until the temperature of said piece is approximately to that of the solution; withdrawing said silicon material from the said solution at a rate whereby an even film of said boric acid is deposited on the surface of said semiconductor material; heating said material at approximately 1300° C. to diffuse boron from said boric acid into a portion of said silicon piece for forming a p-type impurity region and to deposit a layer of glass-like non-metallic masking material containing at least boron, silicon and oxygen on the surface of said silicon piece; removing a portion of said masking material and a portion of said p-type impurity region to expose a portion of said n-type silicon piece; and diffusing an n-type impurity into said exposed n region of said piece at a temperature of approximately 1200° C. to form an n+ region, whereby a piece of silicon material having a p-n-n+ configuration is obtained.

5. A method of preparing silicon diodes comprising the steps of placing a piece of silicon material containing an n-type impurity into a concentrated solution of boric acid at a temperature of 90–100° C. for a period of time until the temperature of said piece is approximately to that of the solution; withdrawing said silicon material from said solution at a rate whereby an even film of said boric acid is deposited on the surface of said semiconductor material; heating said material at approximately 1300° C. to diffuse boron from said boric acid into a portion of said silicon piece for forming a p-type impurity region and to deposit a layer of glass-like non-metallic masking material containing at least boron, silicon and oxygen on the surface of said silicon piece; removing a portion of said masking material and a portion of said p-type impurity region to expose a portion of said n-type silicon piece; diffusing an n-type impurity into said exposed n region of said piece at a temperature of approximately 1200° C. to form an n+ region, whereby a piece of silicon material having a p-n-n+ configuration is obtained; and cutting said piece to form a plurality of silicon diodes from said piece of p-n-n+ silicon material.

References Cited in the file of this patent

UNITED STATES PATENTS

| | | |
|---|---|---|
| 2,697,269 | Fuller | Dec. 21, 1954 |
| 2,771,382 | Fuller | Nov. 20, 1956 |
| 2,794,846 | Fuller | June 4, 1957 |
| 2,804,405 | Derick et al. | Aug. 27, 1957 |
| 2,816,850 | Haring | Dec. 17, 1957 |
| 2,861,018 | Fuller et al. | Nov. 18, 1958 |